United States Patent
Nagatomo et al.

(10) Patent No.: US 6,828,207 B2
(45) Date of Patent: Dec. 7, 2004

(54) METHOD OF FABRICATING A CAPACITOR STRUCTURE HAVING HEMISPHERICAL GRAINS

(75) Inventors: Yoshiki Nagatomo, Tokyo (JP); Shoji Yo, Tokyo (JP); Osamu Nanba, Tokyo (JP); Hiroaki Uchida, Miyagi (JP); Kazuya Suzuki, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/352,947

(22) Filed: Jan. 29, 2003

(65) Prior Publication Data

US 2003/0186510 A1 Oct. 2, 2003

(30) Foreign Application Priority Data

Mar. 26, 2002 (JP) ........................................ 2002-085759

(51) Int. Cl.$^7$ .............................................. H01L 21/20
(52) U.S. Cl. ...................... 438/398; 438/246; 438/389; 438/255; 438/659
(58) Field of Search ................................ 438/238, 239, 438/244, 246, 251, 253–255, 387, 389, 394, 396–398, 597, 657–659, 665, 964

(56) References Cited

U.S. PATENT DOCUMENTS

| | | | |
|---|---|---|---|
| 5,943,570 A | | 8/1999 | Park et al. |
| 6,090,681 A | | 7/2000 | Yamamoto |
| 6,159,785 A | * | 12/2000 | Tsuchimoto et al. ........ 438/238 |
| 6,218,230 B1 | | 4/2001 | Fujiwara et al. |
| 6,385,020 B1 | | 5/2002 | Shin et al. |

FOREIGN PATENT DOCUMENTS

JP        2000-164828        6/2000

* cited by examiner

*Primary Examiner*—Amir Zarabian
*Assistant Examiner*—Khanh Duong
(74) *Attorney, Agent, or Firm*—Volentine Francos & Whitt, PLLC

(57) ABSTRACT

A first insulating layer is formed on semiconductor substrate, and a trench is formed in the first insulating layer. An amorphous silicon layer doped with impurities is formed on a side and bottom walls of the trench. Next, a resist material is partially filled in the trench so that an upper portion of the amorphous silicon layer is exposed. The exposed portion is implanted with impurity ions. After removal of the resist material, the amorphous silicon layer is heat treated so as to grow hemispherical grains on its surface.

18 Claims, 5 Drawing Sheets

METHOD OF FABRICATING A CAPACITOR STRUCTURE HAVING HEMISPHERICAL GRAINS

BACKGROUND OF THE INVENTION

1. Field of the Invention

The invention relates to a semiconductor memory and a method of fabricating the same, and more particularly, to a capacitor of a semiconductor memory device having a hemispherical grained (HSG) layer and a method of fabricating the same.

2. Description of Related Art

A conventional forming method of a semiconductor memory device is explained in the following manner. A trench is formed in a silicon substrate 1 and this trench is filled with a CVD oxide. The trench is planarized by chemical mechanical polishing (CMP) technique, so that a trench isolation region 2 is formed (see FIG. 1A).

Thereafter, a layer of thin oxide 3 is grown on all the surfaces by thermal oxidation. Layers of polycrystalline silicon 4 and tungsten 5 are next deposited by CVD, and etched in order to define gate electrodes 6 of MOS transistors and interconnects 7 (see FIG. 1B).

Next, a layer of interoxide 8 is deposited by CVD, and etched to define a bitline contact hole 9 in the layer of interoxide 8. Layers of polysilicon 10 and tungsten suicide 11 are deposited on all the surfaces, and etched to form a bitline 12 (see FIG. 1C)

Moreover, layers of interoxide 13 silicon nitride 14 are respectively deposited by CVD. Cell contact holes 15 are defined both in layers interoxide 13 and silicon nitride 14 by etching. A layer of polycrystalline silicon 16 heavily doped impurities is deposited on all the surfaces, and is polished by CMP method. Only the contact holes 15 are filled with the polycrystalline silicon 16 (see FIG. 2A).

A layer of a thick insulator 17 is deposited by CVD, and holes are opened in the insulator 17 by etching to form lower electrodes. A layer of a amorphous silicon 18, which is doped phosphorous of 0.5E20 to 3E20 cm-3, is deposited by CVD, and only the opening holes are filled with resists 19(see FIG. 2B).

Next, after all the surfaces are etched, the insulators 17 are removed by hydrogen fluoride solution, resulting that cylindrical lower electrodes 20 are formed (see FIG. 2C).

Heat treatment is carried out in a silane gas ambient under low pressure, and hemispherical grains (HSGs) are grown on the surface of the amorphous silicon 18, so that lower electrodes 20 of cylindrical capacitors have rough surfaces (see FIG. 3A).

A layer of thin silicon nitride 21 is deposited on the lower electrodes 20 by CVD, and a layer 22 of polycrystalline silicon doped impurities is deposited on the silicon nitride 21. As a result, a memory cell, which is composed of a cylindrical capacitor over the MOS transistors, have been completed (see FIG. 3B).

However, in the above-described conventional capacitor structure, there are some problems, as is described below. Stress is caused on a lower electrode surface of a cylindrical capacitor because of a nucleation of a polycrystalline silicon HSG, when a HSG rough surface is formed. The stress is centralized on the top of the cylindrical capacitor, where the grain of HSG closes together. It results that the grains on the top on the lower electrode of the capacitor are peel off and cause a short failure between neighboring capacitors.

SUMMARY OF THE INVENTION

In order to solve these problems, the present invention is provided, wherein a semiconductor memory device, which has a capacitor comprising of both the first electrode located outside of the capacitor and next to the neighboring capacitor and having grain silicon grown from amorphous silicon layer, and the second electrode formed on a semiconductor substrate, in which grain size at the top portion of the first electrode is smaller than the other portions of the first electrode. Also, in the present invention, the impurity concentration at the top portion of the amorphous silicon is higher than the other portions.

According to the present invention, there is provided a method of fabricating a semiconductor device, including forming a trench in the interlayer of semiconductor substrate, depositing impurities doped a amorphous silicon served as a lower electrode all over the trench, forming a resist so as to expose the top portion of the amorphous silicon in the trench, etching the amorphous silicon layer except for the trench, implanting impurities into the top portion of the amorphous silicon and growing HSG silicon by means of heat treatment after resist strip.

DETAILED DESCRIPTION OF THE INVENTION

Figure 1A:
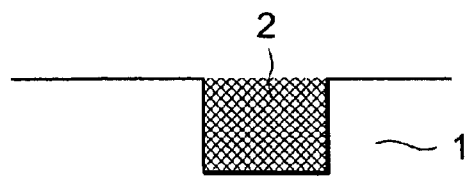
FIGS. 1A to 1C are sectional views for explaining a conventional method for forming a capacitor electrode.
Figure 1B:
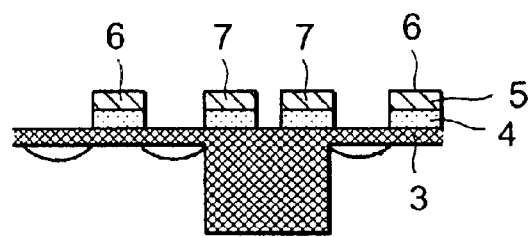
Figure 1C:
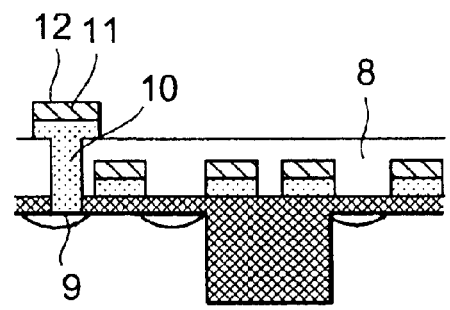
Figure 2A:
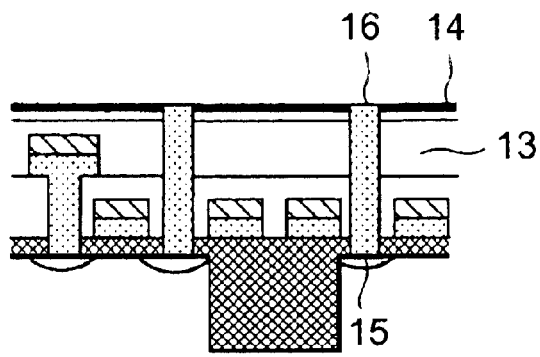
FIGS. 2A to 2C are sectional views for explaining a conventional method for forming a capacitor electrode subsequent to FIG. 1C.
Figure 2B:
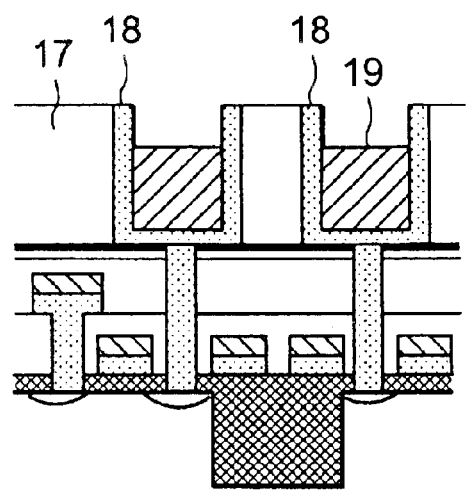
Figure 2C:
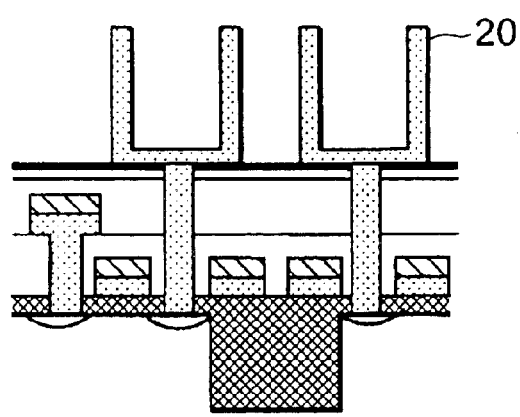
Figure 3A:
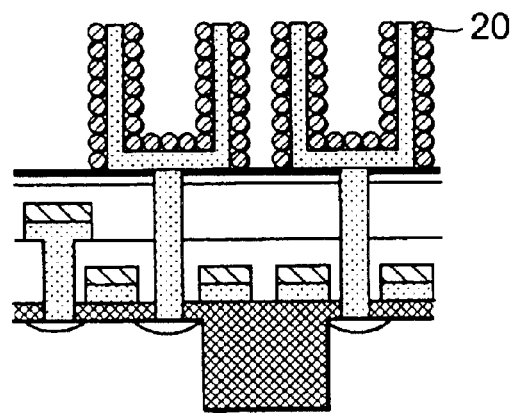
FIGS. 3A to 3B are sectional views for explaining a conventional method for forming a capacitor electrode subsequent to FIG. 2C.
Figure 3B:
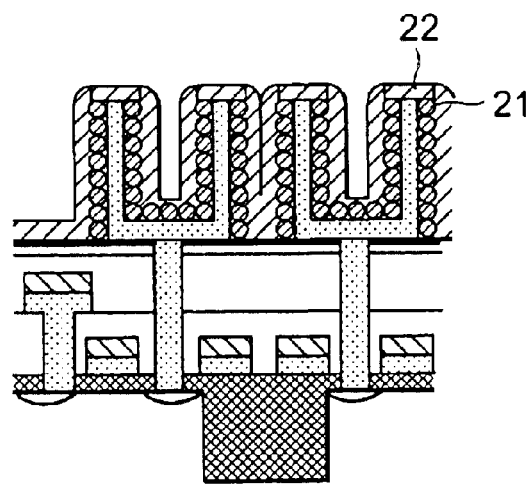
Figure 4A:
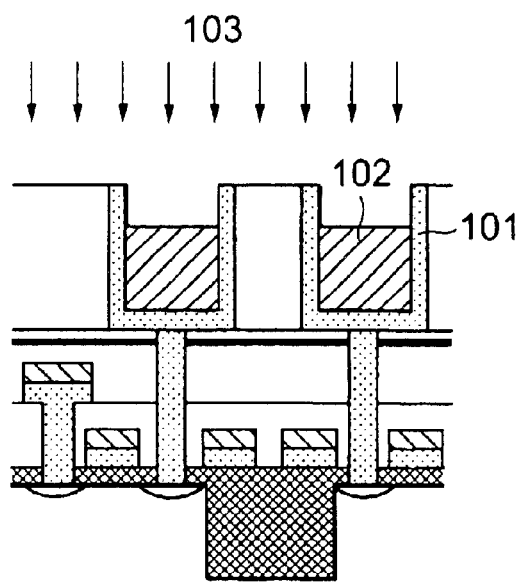
FIGS. 4A to 4C are sectional views for explaining a method for forming a capacitor electrode according to the present invention.
Figure 4B:
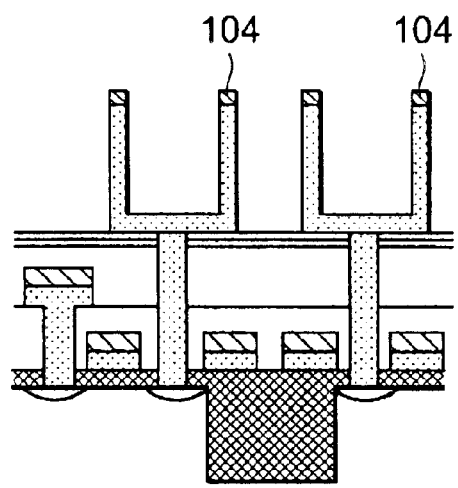
Figure 4C:
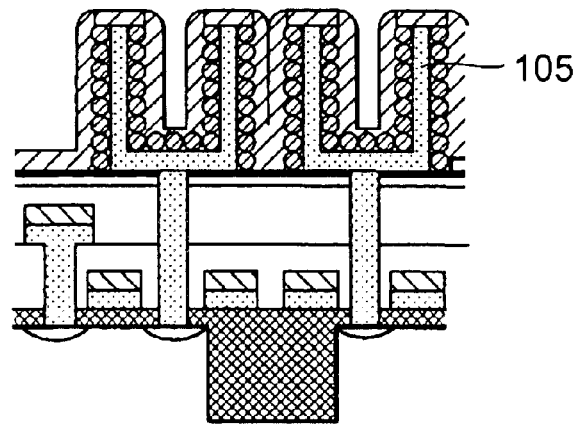

Referring to FIG. 4, after the same processes as the conventional through FIG. 2B to FIG. 1 are performed, a layer of resist 102 is buried inside a layer of amorphous silicon 101, and a upper portion of the layer of the amorphous silicon 101 is exposed, as is shown in FIG. 4A.

Next, phosphorous ions are implanted at about 5 to 15 KeV. Also, arsenic can be implanted instead of phosphorous. The implantation is carried out only at the top portion 104 of the amorphous silicon layer 101, because only the top portion of the amorphous silicon layer 101 is exposed.

At this time, phosphorous ions of 0.5E20 to 3.0E20 cm-3 have already been doped the layer of the amorphous silicon 101, so that phosphorous concentration of the top portion 104 of the amorphous silicon layer 101 becomes higher than the other portions.

Thereafter, heat treatment is carried out in a silane gas ambient under vacuum condition as same as the conventional method, and grain size of the amorphous silicon layer 101 becomes larger. It results that the grain grows into a hemispherical grain (HSG) and the lower electrode 105 of the capacitor has a HSG rough surface.

Moreover, a cylindrical capacitor is formed by using the conventional method.

In the present embodiment, the grain growth rate at the top portion of the lower electrode 104 is larger than at the other portions and it is difficult to form HSG, because phosphorous concentration of the top portion is higher than the other portions.

Figure 5:
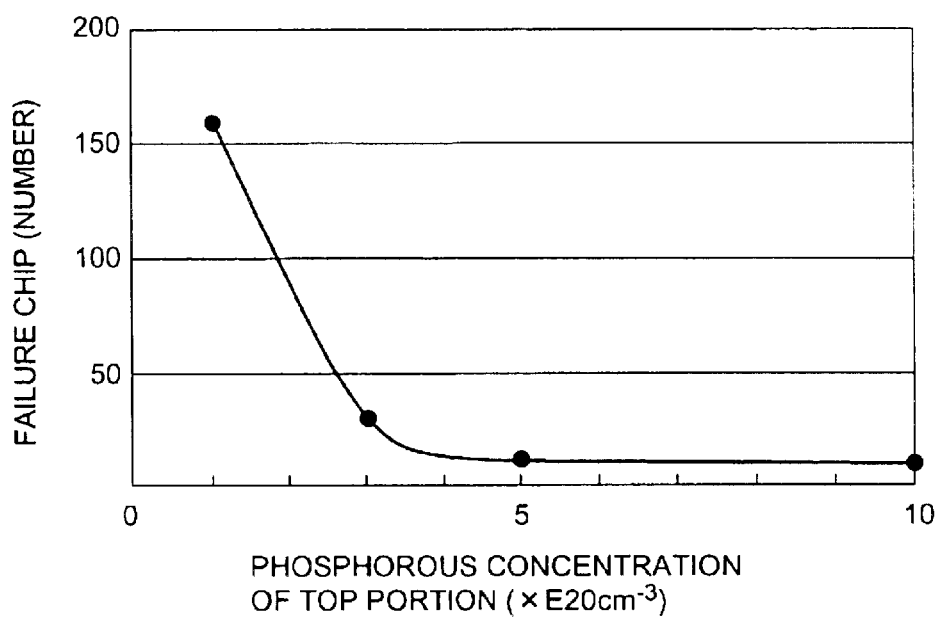
FIG. 5 is a graph showing a failure chip dependent on phosphorous concentration at the top of a lower electrode.

FIG. 5 shows a result that a short failure between neighboring cylindrical capacitors is checked electrically. In FIG. 5, the graph shows failure chip versus phosphorous concentration of the top portion. The graph shows that the failure chip rapidly decrease with increase of the phosphorous concentration and saturates at the concentration of above 3E20 cm-3.

For example, when the amorphous silicon layer 101 has already been doped phosphorous ions of 1E20 cm-3, a net concentration is above 3E20 cm-3 at the top portion if ion implantation is carried out at above 2E20 cm-3 dose.

As described above in detail, in the manufacturing steps of the present invention, the top portion of a amorphous silicon layer is doped phosphorous prior to a HSG growth of the amorphous silicon layer which serves as a lower electrode, wherein the phosphorous concentration of the amorphous silicon layer becomes higher than the other portions. It results that HSG growth is suppressed at the top portion of the amorphous silicon layer. So that the HSG silicon of the top portion does not peel off and failures of electrical short do not occur even if stress is caused during the HSG growth or in the step followed by the HSG growth. Therefore, it is possible to realize highly reliable capacitor.

What is claimed is:

1. A method of fabricating a memory device, said method comprising:

forming a first insulating layer on a semiconductor substrate;

forming a trench in said first insulating layer;

forming an amorphous silicon layer doped with impurities on a sidewall and a bottom wall of the trench;

partially filling the trench with a resist material such that an upper portion of said amorphous silicon layer formed on the sidewall of the trench is exposed;

implanting impurity ions into said upper portion of said amorphous silicon layer;

removing said resist material from within the trench; and heat treating said amorphous silicon layer to grow hemispherical grains on a surface of said amorphous silicon layer after removing said resist material.

2. The method of the claim 1, wherein said impurity is phosphorous or arsenic.

3. The method of the claim 1, wherein, after said implanting ions into the upper portion of said amorphous silicon layer, an impurity concentration of said upper portion of said amorphous silicon layer is more than $3.0 \times 10^{20}$ cm$^{-3}$.

4. The method of the claim 2, wherein, after said implanting ions into the upper portion of said amorphous silicon layer, an impurity concentration of said upper portion of said amorphous silicon layer is more than $3.0 \times 10^{20}$ cm$^{-3}$.

5. A method of manufacturing a capacitor structure, comprising:

providing a semiconductor substrate;

forming a thick layer on the semiconductor substrate;

forming an opening in the thick layer, the opening having a sidewall and a bottom wall;

forming an amorphous silicon layer on the sidewall and the bottom wall of the opening so that an edge of the amorphous silicon layer formed on the sidewall is exposed, the amorphous silicon layer including an impurity at a first concentration;

introducing impurity ions into the exposed edge of the amorphous silicon layer so that the exposed edge of the amorphous silicon layer includes an impurity at a second concentration that is higher than the first concentration;

removing the thick layer so as to expose the amorphous silicon layer;

growing a plurality of hemispherical grains on the exposed amorphous silicon layer;

forming an insulating layer on the hemispherical grains; and forming an electrode layer on the insulating layer.

6. The method of manufacturing a capacitor structure according to claim 5, wherein the thick layer is an insulator layer formed by a CVD method.

7. The method of manufacturing a capacitor structure according to claim 5, wherein the impurity is phosphorous.

8. The method of manufacturing a capacitor structure according to claim 5, wherein the first concentration is about $0.5 \times 10^{20}$ cm$^{-3}$ to $3.0 \times 10^{20}$ cm$^{-3}$.

9. The method of manufacturing a capacitor structure according to claim 5, wherein the second concentration is more than about $3.0 \times 10^{20}$ cm$^{-3}$.

10. The method of manufacturing a capacitor structure according to claim 5, wherein the insulating layer is a silicon nitride layer.

11. The method of manufacturing a capacitor structure according to claim 5, wherein the electrode layer is a polycrystalline silicon layer doped with an impurity.

12. A method of manufacturing a memory cell structure, comprising:

providing a semiconductor substrate;

forming a transistor on the semiconductor substrate;

forming a first insulating layer on the transistor and the semiconductor substrate so that the transistor is covered by the first insulating layer;

forming a contact hole in the first insulating layer so that an electrode of the transistor is exposed;

forming a conductive material in the contact hole so that a part of the conductive material is exposed;

forming a thick layer on the first insulating layer;

forming an opening in the thick layer so as to expose the part of the conductive material, the opening having a sidewall and a bottom wall exposing the part of the conductive material;

forming an amorphous silicon layer on the sidewall and the bottom wall of the opening so that an edge of the amorphous silicon layer formed on the sidewall is exposed, the amorphous silicon layer including an impurity at a first concentration;

introducing impurity ions into the exposed edge of the amorphous silicon layer so that the exposed edge of the amorphous silicon layer includes an impurity at a second concentration that is higher than the first concentration;

removing the thick layer so as to expose the amorphous silicon layer;

growing a plurality of hemispherical grains on the exposed amorphous silicon layer;

forming a second insulating layer on the hemispherical grains; and forming an electrode layer on the insulating layer.

13. The method of manufacturing a memory cell structure according to claim 12, wherein the thick layer is an insulator layer formed by a CVD method.

14. The method of manufacturing a memory cell structure according to claim 12, wherein the impurity is phosphorous.

15. The method of manufacturing a memory cell structure according to claim 12, wherein the first concentration is about $0.5 \times 10^{20}$ cm$^{-3}$ to $3.0 \times 10^{20}$ cm$^{-3}$.

16. The method of manufacturing a memory cell structure according to claim 12, wherein the second concentration is more than about $3.0 \times 10^{20}$ cm$^{-3}$.

17. The method of manufacturing a memory cell structure according to claim 12, wherein the second insulating layer is a silicon nitride layer.

18. The method of manufacturing a memory cell structure according to claim 12, wherein the electrode layer is a polycrystalline silicon layer with doped impurity.

* * * * *